(12) United States Patent
Coldren et al.

(10) Patent No.: US 6,841,407 B2
(45) Date of Patent: Jan. 11, 2005

(54) METHOD FOR APERTURING VERTICAL-CAVITY SURFACE-EMITTING LASERS (VCSELS)

(75) Inventors: Larry A. Coldren, Santa Barbara, CA (US); Eric M. Hall, Santa Barbara, CA (US); Shigeru Nakagawa, Goleta, CA (US); Guilhem Almuneau, Aesch Bei Birmensdorf (CH)

(73) Assignee: The Regents of the University of California, Oakland, CA (US)

( * ) Notice: Subject to any disclaimer, the term of this patent is extended or adjusted under 35 U.S.C. 154(b) by 376 days.

(21) Appl. No.: 09/935,352

(22) Filed: Aug. 21, 2001

(65) Prior Publication Data

US 2002/0101894 A1 Aug. 1, 2002

Related U.S. Application Data

(60) Provisional application No. 60/227,165, filed on Aug. 22, 2000, provisional application No. 60/227,161, filed on Aug. 22, 2000, provisional application No. 60/226,866, filed on Aug. 22, 2000, and provisional application No. 60/262,541, filed on Jan. 16, 2001.

(51) Int. Cl.[7] .................................................. H01S 5/00
(52) U.S. Cl. .......................................... 438/22; 372/46
(58) Field of Search .................. 438/22–40; 372/43–50, 372/96

(56) References Cited

U.S. PATENT DOCUMENTS

| | | | |
|---|---|---|---|
| 4,829,347 A | 5/1989 | Cheng et al. | |
| 5,045,499 A | 9/1991 | Nishizawa et al. | |
| 5,082,799 A | 1/1992 | Holmstrom et al. | |
| 5,245,622 A | 9/1993 | Jewell et al. | |
| 5,251,225 A | 10/1993 | Eglash et al. | |
| 5,293,392 A | 3/1994 | Shieh et al. | |
| 5,343,487 A | 8/1994 | Scott et al. | |
| 5,358,880 A | 10/1994 | Lebby et al. | |
| 5,392,307 A | 2/1995 | Sugiyama et al. | |
| 5,416,044 A | 5/1995 | Chino et al. | |
| 5,422,901 A | 6/1995 | Lebby et al. | |
| 5,468,343 A | 11/1995 | Kitano | |
| 5,568,504 A | 10/1996 | Köck et al. | |
| 5,588,995 A | 12/1996 | Sheldon | |
| 5,631,472 A | 5/1997 | Cunningham et al. | |
| 5,693,180 A | 12/1997 | Furukawa et al. | |
| 5,719,891 A | 2/1998 | Jewell | |
| 5,877,038 A | 3/1999 | Coldren et al. | |
| 5,974,073 A | 10/1999 | Cannard et al. | |
| 5,985,683 A | 11/1999 | Jewell | |
| 5,991,326 A | 11/1999 | Yuen et al. | |
| 6,021,147 A | 2/2000 | Jiang et al. | |
| 6,057,560 A | 5/2000 | Uchida | |
| 6,061,380 A | 5/2000 | Jiang et al. | |
| 6,127,200 A | 10/2000 | Ohiso et al. | |
| 6,207,973 B1 | 3/2001 | Sato et al. | |

FOREIGN PATENT DOCUMENTS

| | | |
|---|---|---|
| JP | 57026492 A | 2/1982 |
| WO | WO 98/07218 | 2/1998 |

OTHER PUBLICATIONS

K.A. Black et al., "Double–fused 1.5 μm vertical cavity lasers with record high $T_o$ of 132K at room temperature" *Electronics Letters*, vol. 34, pp. 1947–1949 (Oct. 1998).

(List continued on next page.)

*Primary Examiner*—Quyen Leung
(74) *Attorney, Agent, or Firm*—Greenberg Traurig, LLP; Charles Berman, Esq.

(57) ABSTRACT

A method for aperturing a vertical-cavity surface-emitting laser (VCSEL), for increasing the external quantum efficiency and decreasing the threshold current, involves an etching mixture that is applied to the active region of the VCSEL. The etching mixture is designed in a manner to selectively etch the active region of the VCSEL at a rate substantially faster than the etch rate of at least one of the multiple DBRS associated with the VCSEL.

93 Claims, 5 Drawing Sheets

OTHER PUBLICATIONS

V. Jayaraman et al., "Uniform threshold current, continuous–wave, singlemode 1300nm vertical cavity lasers from 0 to 70° C," *Electronics Letters*, vol. 34, pp. 1405–1407 (Jul. 1998).

M. Ortsiefer et al, "Submilliamp long–wavelength InP–based vertical–cavity surface–emitting laser with stable linear polarization," *Electronics Letters*, vol. 36, pp. 1124–1126 (Jun. 2000).

W. Yuen et al., "High–performance 1.6$\mu$m single–epitaxy top–emitting VCSEL," *Electronics Letters*, vol. 36, pp. 1121–1123 (Jun. 2000).

O. Blum et al., "Electrical and optical characteristics of AlAsSb/GaAsSb distributed Bragg reflectors for surface emitting lasers," *Appl. Phys. Lett.*, vol. 67, pp. 3233–3235 (Nov. 1995).

O. Blum et al, "Highly reflective, long wavelength AlAsSb/ GaAsSb distributed Bragg reflector grown by molecular beam epitaxy on InP substrates," *Appl. Phys. Lett.*, vol. 66, pp. 329–331 (Jan. 1995).

J. Boucart et al., "1–mW CW–RT Monolithic VCSEL at 1.55 $\mu$m," *IEEE Photonics Technology Letters*, vol. 11, pp. 629–631 (Jun. 1999).

T. Uchida et al, "CBE Grown 1.5 $\mu$m GaInAsP–InP Surface Emitting Lasers," *IEEE Journal of Quantum Electronics*, vol. 29, pp. 1975–1980 (Jun. 1993).

M.G. Peters et al., "Band–gap engineered digital alloy interfaces for lower resistance vertical–cavity surface–emitting lasers," *Appl. Phys. Lett.*, vol. 63, pp. 3411–3413 (Dec. 1993).

E. Hall et al., "Electrically–pumped, single–epitaxial VCSELs at 1.55 $\mu$m with Sb–based mirrors," *Electronics Letters*, vol. 35, pp. 1–2, (Aug. 1999).

G. Almuneau, et al., "Improved electrical and thermal properties of InP–AlGaAsSb Bragg mirrors for long–wavelength vertical–cavity lasers," *IEEE Photonics Technology Letters*, vol. 12, pp. 1322–1324 (Oct. 2000).

E. Hall et al, "Selectively Etched Undercut Apertures in AlAsSb–Based VCSELs," submitted to *IEEE Photonics Technology Letters*, vol. 13, pp. 97–99 (Feb. 2001).

G. Almuneau et al., "Molecular beam epitaxial growth of monolithic 1.55 $\mu$m vertical cavity surface emitting lasers with AlGaAsSb/AlAsSb Bragg mirrors," *Journal of Vacuum Science & Technology B*, vol. 18, pp. 1601–1604 (May/Jun. 2000).

J.W. Scott et al, "High Efficiency Submilliamp Vertical Cavity Lasers with Intracavity Contacts," *IEEE Photonics Technology Letters*, vol. 6, pp. 678–680 (Jun. 1994).

R.N. Naone, and L.A. Coldren, "Tapered Air Apertures for Thermally Robust VCL Structures," *IEEE Photonics Technology Letters*, vol. 11, pp. 1339–1341 (Nov. 1999).

J.K. Kim et al, "Epitaxially–stacked multiple–active–region 1.55 $\mu$m lasers for increased differential efficiency," *Applied Physics Letters*, vol. 74, pp. 3251–3253 (May 1999).

J. Piprek et al., "Minimum temperature sensitivity of 1.55 $\mu$m vertical–cavity lasers at—30nm gain offset," *Applied Physics Letters*, vol. 72, pp. 1814–1816 (Apr. 1998).

E. Hall et al., "Increased Lateral Oxidation Rates of AllnAs on InP using Short–Period Superlattices," *Electronic Materials Conference, Journ. Electron. Materials*, vol. 29, No. 9, pp. 1100–1104 (2000), no month.

E.R. Hegblom et al., "Small efficient vertical cavity lasers with tapered oxide apertures," *Electronics Letters*, vol. 34, pp. 895–896 (Apr. 1998).

G. Almuneau et al., "Accurate control of Sb composition in AlGaAsSb alloys on InP substrates by molecular beam epitaxy," *Journal of Crystal Growth*, vol. 208, pp. 113–116 (1999), no month.

J.K. Kim, et al., "Room–temperature, electrically–pumped multiple–active–region VCSELs with high differential efficiency at 1.55 $\mu$m," *Electronics Letters*, vol. 35, pp. 1084–1085, No. 13, pp. 1–2 (Jun. 1999).

M. Sugimoto, et al., "Surface emitting devices with distributed Bragg reflectors grown by highly precise molecular beam epitaxy," *Journal of Crystal Growth*, vol. 127, pp. 1–4, (1993), no month.

M. Yano, et al., "Time–resolved reflection high energy electron diffraction analysis for atomic layer depositions of GaSb by molecular beam epitaxy," *Journal of Crystal Growth*, vol. 146, pp. 349–353 (1995), no month.

C. Starck, "Long Wavelength VCSEL with Tunnel Junction and Metamorphic Al As/GaAs Conductive DBR", LEOS '99: IEEE Lasers and Electro–Optics Society 1999 12th Annual Meeting, Nov. 1999, vol. 1, pp. 139–140, especially Figure 1.

K.D. Choquette et al., "Room Temperature Continuous Wave InGaAsN Quantum Well Vertical–Cavity Lasers Emitting at 1.3 $\mu$m", Electronics Letters, Aug. 3, 2000, vol. 36 No. 16, pp. 1388–1390.

METHOD FOR APERTURING VERTICAL-CAVITY SURFACE-EMITTING LASERS (VCSELS)

The contents of this application are related to those provisional applications having Ser. Nos. 60/227,165, 60/227,161, and 60/226,866, filed Aug. 22, 2000, and a provisional application having Ser. No. 60/262,541, filed Jan. 16, 2001. The present application claims priority to these related provisional patent applications and their contents are hereby incorporated by reference in their entirety into the present disclosure. The contents of this application are also related to several nonprovisional patent applications being filed concurrently herewith. These nonprovisional patent applications are hereby incorporated by reference in their entirety and have the following attorney docket reference numerals: 510015-263, 510015-264, 510015-265, 510015-266, 510015-268, 510015-269, 510015-270, 510015-271, and 510015-272.

This invention was made with the support of the United States Government under Grant No. MDA972-98-1-0001, awarded by the Department of Defense (DARPA). The Government has certain rights in this invention under 35 U.S.C. §202.

BACKGROUND OF THE INVENTION

1. Field of the Invention

The present invention relates to a surface emitting semiconductor laser and a method for manufacturing the same. Especially the present invention relates to a vertical-cavity surface-emitting semiconductor laser for long wavelengths (i.e., 1.3 to 1.55 μm) to be used as an optical source for a system of optical communication, optical interconnection, optical data-processing, or the like, in the field of optical data-communication or optical data-processing, and also to a method for manufacturing the novel vertical-cavity surface-emitting semiconductor lasers for long wavelengths.

2. General Background

Significant recent progress in the development of vertical-cavity surface-emitting lasers (VCSEL's) emitting at 1.3–1.55 μm is quickly making these light sources a viable option as high-performance components for optical fiber networks. In addition to offering cost advantages through such features as on-wafer testing, VCSEL's also have inherent advantages over edge-emitters such as scalability to two-dimensional arrays. Although many of the best results for these devices have resulted from the wafer-fusion or metamorphic growth of AlGaAs-based distributed Bragg reflector (DBR) mirrors with InP-based active regions, there is still considerable interest in the monolithic growth of long-wavelength VCSEL's completely lattice-matched to InP. Essentially, lattice-matched, highly reflective AsSb-based DBRs eliminate the need for the complicated mirror schemes.

The mirror stacks are formed of multiple pairs of layers often referred to as mirror pairs. The pairs of layers are formed of a material system generally consisting of two materials having different indices of refraction and being easily lattice matched to the other portions of the VCSEL. For example, a GaAs based VCSEL typically uses an $Al_{x1}Ga_{1-x1}As\backslash Al_{x2}Ga_{1-x2}As$ material system wherein the different refractive index of each layer of a pair is achieved by altering the aluminum content x1 and x2 in the layers, more particularly the aluminum content x1 ranges from 0% to 50% and the aluminum content of x2 ranges from 50% to 100%. In conventional devices, the number of mirror pairs per stack may range from 20–40 pairs to achieve a high percentage of reflectivity, depending on the difference between the refractive indices of the layers. The large number of pairs increases the percentage of reflected light.

In summary, a VCSEL includes a first distributed Bragg reflector (DBR), also referred to as a mirror stack, formed on top of a substrate by semiconductor manufacturing techniques, an active region formed on top of the first mirror stack, and a second mirror stack formed on top of the active region. The VCSEL is driven by current forced through the active region.

SUMMARY OF THE INVENTION

Apertures in VCSEL's, both oxide and air, have been used extensively in VCSELs to confine the current to the center of the device and to define a waveguide that keeps the optical mode away from the etched side-walls of the device. These apertures, however, have always been placed away from the active region itself allowing carriers to spread either before they reach the active region or in the quantum wells themselves. This carrier spreading results in a scattering loss in the cavity along with an associated optical loss. Subsequently, these losses limit the reduction in threshold current and increase in the external quantum efficiency. Thus, what is needed is a method for manufacturing VCSEL's that further reduces the threshold current and further increases the external quantum efficiency.

Accordingly, in one embodiment of the present invention, a vertical-cavity surface-emitting laser (VCSEL) for increasing external quantum efficiency is comprised of a first reflecting surface (a first DBR), a second reflecting surface (second DBR), and an active region having a selectively etched aperture with a predetermined size. The aperture is etched into the active region to reduce loss due to scattering in a cavity of a VCSEL, thereby increasing external quantum efficiency of the VCSEL. A selective etch that controls the rate of etching of the active region in relation to the DBR's is applied to the active region and the DBR's. This selective or preferential etch substantially removes the active region of the VCSEL while leaving the DBRs substantially intact, thereby aperturing the current as well as the optical mode to the center of the VCSEL structure. This selective etch is preferably performed by a predetermined ratio of citric acid to hydrogen peroxide.

Accordingly, in another embodiment of the present invention, a vertical-cavity surface-emitting laser (VCSEL) for decreasing threshold current density comprises: (i) a first reflecting surface, (ii) a second reflecting surface, (iii) an active region with a first surface and a second surface, (iv) a first cladding layer between the first reflecting surface and the first surface of the active region, (v) a second cladding layer between the second reflecting surface and the second surface of the active region, (vi) an aperture formed by selectively etching the active region to a predetermined ratio of the size of the active region to the size of a DBR. The aperture is formed adjacent the active region to reduce loss due to scattering in a cavity of a VCSEL, thereby decreasing threshold current density in the VCSEL. The VCSEL may also have a tunnel junction on the first surface of the active region.

Accordingly in another embodiment, specific etchants can be used to etch the active region, while simultaneously precluding etching of the cladding layers. This can be done by protecting the sidewalls of the reflecting mirrors with a dielectric coating and then etching the active region with the etchants.

BRIEF DESCRIPTION OF THE DRAWINGS

In order that the manner in which the above-recited advantages and objects of the invention are attained, as well as others which will become apparent, more particular description of the invention briefly summarized above may be had by reference to the specific embodiments thereof that are illustrated in the appended drawings. It is to be understood, however, that the appended drawings illustrate only typical embodiments of the invention and are therefore not to be considered limiting of its scope, for the invention may admit to other equally effective embodiments.

DETAILED DESCRIPTION OF PREFERRED EMBODIMENTS OF THE INVENTION

Figure 1:
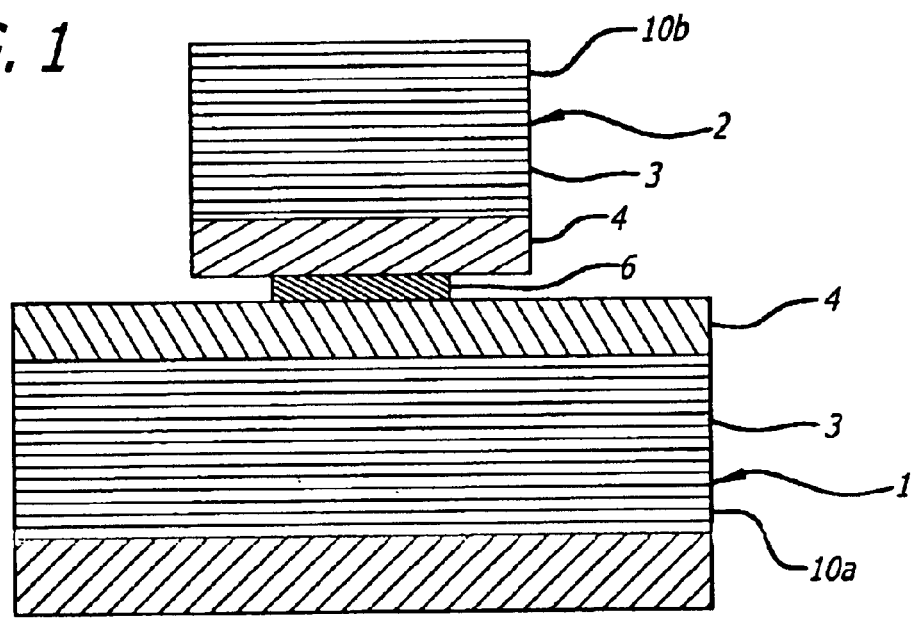
FIG. 1 depicts a schematic of the VCSEL which is grown by molecular beam epitaxy on an n-doped (Sn) InP substrate.

A schematic for the VCSEL structure is shown in FIG. 1. The bottom DBR 1 and the top DBR 2 consist, respectively, of preferably twenty-three and thirty-two pairs of $Al_{a1}Ga_{1-a1}As_xSb_{1-x}$ and $Al_{a2}Ga_{1-a2}As_xSb_{1-x}$ ($a_1>0.9$, $a_2<0.3$, $x>0.5$) $\lambda/4$-layers, generally shown as 3, lattice-matched to InP cladding layers 4. Lattice-matching is achieved by using previously-calibrated group-V induced reflection high-energy electron diffraction oscillations and then growing at conditions with near-unity antimony incorporation rates. As an alternative, only the top cladding layer or the bottom cladding layer may be present in the VCSEL depicted in FIG. 1. A small amount of Ga is generally added to the AlAsSb reflecting surfaces so as to stabilize these surfaces chemically, and make them more resistive to degradation without substantially increasing their index of refraction.

This method ensures both reproducibility of results without daily repetition of the calibrations and also reliability of lattice-matching throughout a single growth. Both the DBR mirrors are doped uniformly n-type with PbTe and have linearly graded interfaces between the low- and high-index layers. The doping level is chosen to be $n\sim1\times10^{18}/cm^3$ in the AlAsSb near the cavity and $n\sim4\times10^{18}/cm^3$ in the AlAsSb several periods (about two penetration lengths of the mode) away from the cavity.

Figure 2:
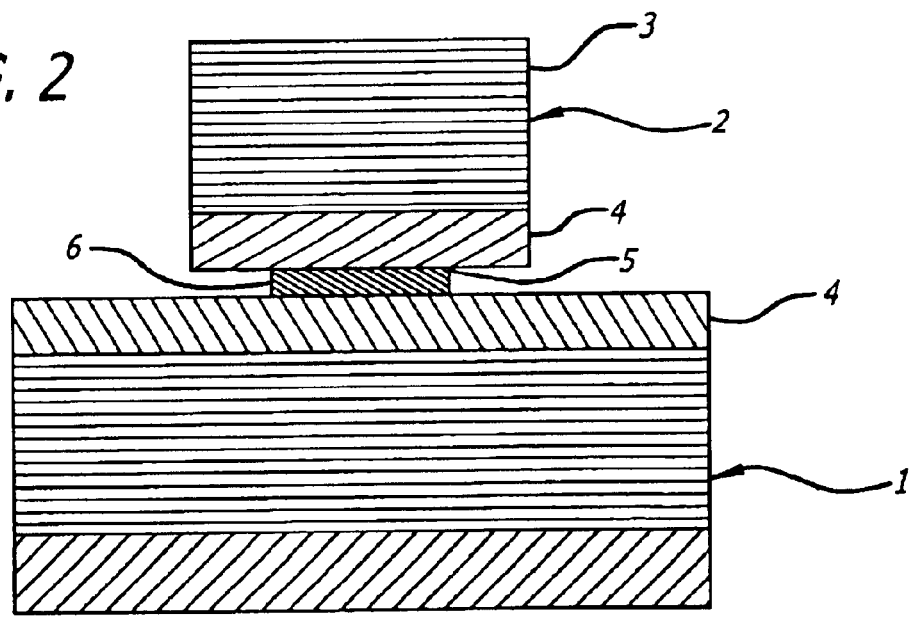
FIG. 2 depicts a schematic of the VCSEL which is grown by molecular beam epitaxy on an n-doped (Sn) InP substrate, further having a tunnel junction between the top InP cladding layer and the active region.

In order to provide electron-hole conversion from the top n-mirror, a thin, heavily-doped tunnel junction 5, using $CBr_4$ as the p-type dopant and Si as the n-type dopant, may be placed at a standing-wave null of the mode in the cavity (shown in FIG. 2, but not in FIG. 1). Holes are created by extraction of electrons from the valence band of the p-type layer in the tunnel junction. By using two n-type DBRs and placing the heavily-doped tunnel junction at a standing-wave null, the optical loss in this structure is minimized.

In another embodiment, conduction through one or both of the mirrors can be avoided by doping the thick InP cladding layers to serve as contact layers in a double-intracavity design. In this case, an electrical connection is made to one or both of the cladding layers. Using the tunnel junction 5 allows for the use of n-type contact layers which have both higher electrical conductivity and lower optical loss than similarly-doped p-type layers.

The cavity has an optical thickness of 1-$\lambda$ and is grown entirely in the lattice-matched InAlGaAs system. Five strain-compensated InAlGaAs quantum wells, which have a large conduction band offset and are therefore promising for high temperature performance, are used as the active region 6. A thin (50 Å), heavily-doped layer of lattice-matched InGaAs is grown after the final mirror period to provide a better contact layer.

The structure, depicted in FIG. 1, is fabricated into devices of diameters 10 to 100 $\mu$m by $Cl_2$ reactive ion etching using a combination of the top TiPtAu contact and $SrF_x$ as an etch mask. Contact to the bottom is made through the substrate using a broad-area NiAuGe contact. The active region 6 of the device is etched by a mixture that preferably uses citric acid and hydrogen peroxide. The etch is highly selective over a range of chemistries, with selectivity almost 100:1 existing between the active region and both the DBRs and InP substrate.

Alternatively, specific etchants such as $H_3PO_4$, or $H_2O_2$, or any combination thereof can be used to etch the active region, while simultaneously precluding etching of the cladding layers. This can be done by protecting the sidewalls 10a and/or 10b of the reflecting mirrors with a dielectric coating and then etching the active region with the etchants.

Figure 3:
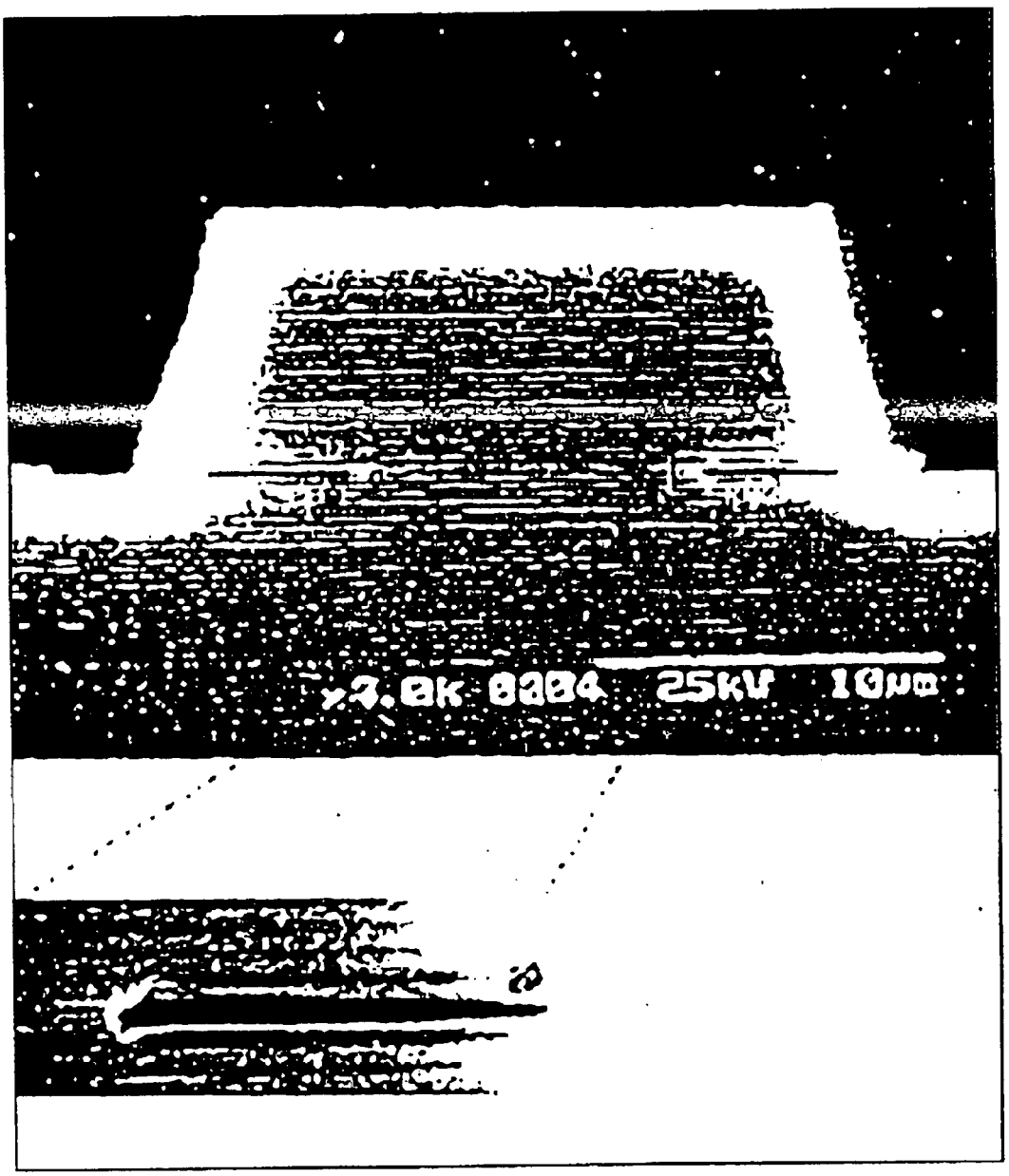
FIG. 3 shows a cross-sectional SEM micrograph view of a test VCSEL structure etched for 60 minutes in a mixture comprising of citric acid and hydrogen peroxide having a predetermined ratio of about 2.2:1.

A cross-sectional SEM micrograph of a test VCSEL structure etched for 60 minutes in $CH_3COOH:H_2O_2::2.2:1$ is shown in FIG. 3. Alternatively, the etch ratio of citric acid to hydrogen peroxide may be about 3:1, and the etching mixture may contain compounds in addition to the citric acid and the hydrogen peroxide. The active region has been undercut by over 6 $\mu$m. The AlAsSb-based DBRs, however, have not been etched significantly during this period. No protection is placed on top of the structure, but all the mirror periods are still visible. Citric acid, when diluted with hydrogen peroxide, etches InAlGaAs compounds much faster than both InP and AlGaAsSb compounds.

The arrow-like shape of the undercut tip is produced by a combination of two factors. First, the higher InGaAs composition of the quantum wells caused a slightly higher etch rate in the center of the cavity. Additionally, the exposed AlAsSb layers that directly clad the active region have oxidized and expanded, manifesting as thicker layers away from the tip and providing the small lip that is seen.

Using this same etch chemistry, a set of processed 50 $\mu$m diameter VCSELs were repeatedly etched and tested after each etch. The etch depth is calibrated by etching test samples at the same time and additionally by cross-sectional SEM of non-VCSEL structures on the laser samples. The strong selectivity of the etch allowed the finished lasers to be etched without damaging the AlGaAsSb/AlAsSb DBRs.

Figure 4:
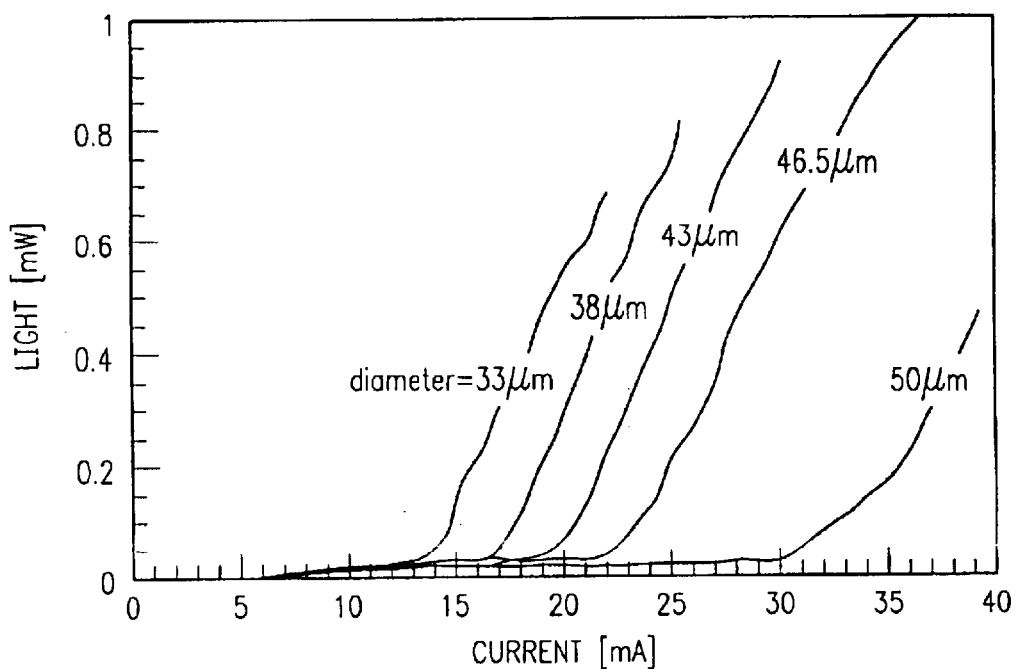
FIG. 4 shows a plot representing the threshold current reduction with each etch as the aperture size defined by the underetch is also decreased.

As shown in FIG. 4, the threshold current decreases with each etch as the aperture size defined by the underetch is also decreased, reaching a minimum of 13 mA for a 33 $\mu$m device (50 $\mu$m pillar with 8.5 $\mu$m undercut). For example, a 50 micron device has a threshold current of about 30 mA, whereas after etching, a 46.5 micron device has a threshold current of about 22 mA. This corresponds to a reduction in threshold current by about 26%. The threshold current density is relatively constant during these etches, decreasing slightly initially as the optical loss is reduced. The reverse current also decreases slightly during this process, indicating no leakage currents are being introduced.

Figure 5:
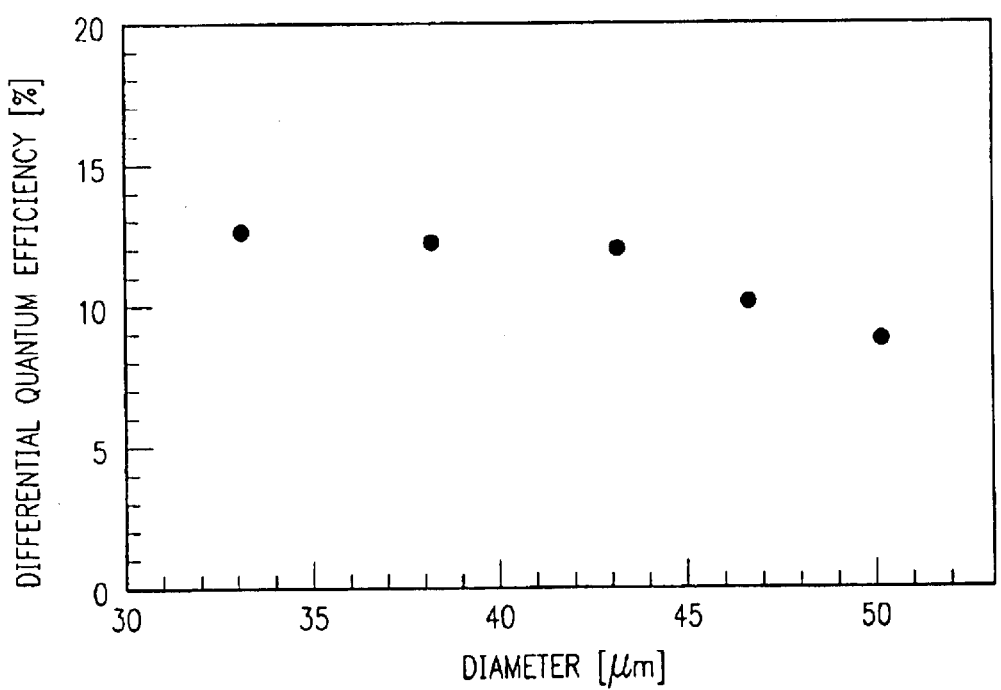
FIG. 5 depicts the improvement in the external quantum efficiency with etching.

The external quantum efficiency for these lasers is plotted in FIG. 5. The efficiency improves with etching, rising to 13%. For example, a 50 micron device has a quantum efficiency of about 9%, whereas after etching, a 46.5 micron device has a quantum efficiency of about 10%. This corresponds to an increase in quantum efficiency by about 11%. This improvement indicates a reduction in optical loss as the aperture confines the mode away from the etched sidewalls and therefore reduces the scattering associated with these rough surfaces.

Another important benefit of this aperturing technique, however, is the ability to decrease the active area while maintaining a constant contact area. This reduces the power consumed by the device and therefore limits the heating in the active region. Since the thermal conductivity of the AsSb-based DBRs is very low, this minimization of the power is very important to device performance.

Figure 6:
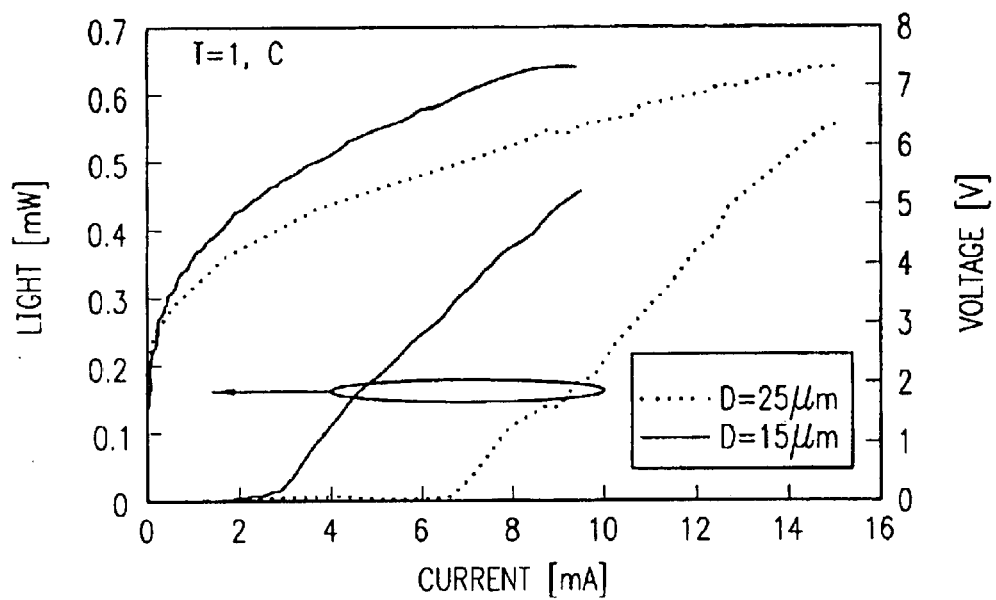
FIG. 6 shows the L-I-V from a 25 $\mu$m diameter device and the L-I-V from the same device with a 5 $\mu$m aperture, forming a 15 $\mu$m device.

FIG. 6 shows the L-I-V from a 25 $\mu$m diameter device and the L-I-V from the same device with a 5 $\mu$m aperture, forming a 15 $\mu$m device. The threshold current has been reduced by more than half from 6.1 mA to 2.8 mA, which does correspond to a slight increase in threshold current density from 1.2 kA/cm$^2$ to 1.6 kA/cm$^2$. However, the threshold voltage is relatively unchanged, so the dissipated power for this device at threshold has been reduced from 35.8 mW to 16 mW, demonstrating the benefit of aperturing these devices. Additionally, the external quantum efficiency has increased slightly, again implying that the aperturing decreases the optical loss in the structure.

The threshold current of lasers to which this etch is applied decreases with each etch as the aperture size defined by the underetch is also decreased. The current density is seen to decrease slightly for the initial etches and the external quantum efficiency also improves, demonstrating the beneficial aperturing effects of the undercut.

Figure 7:
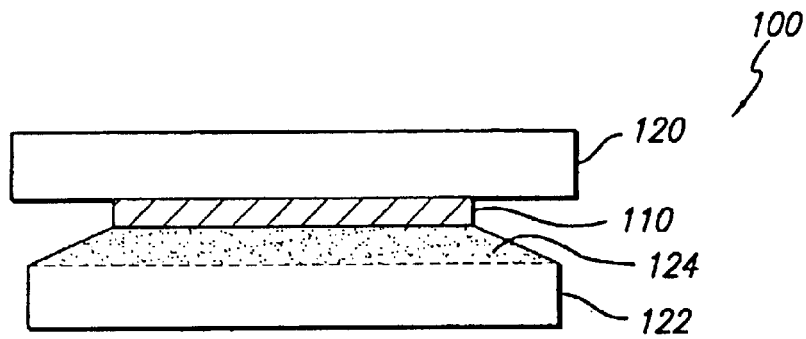
FIG. 7 shows a tapered aperturing scheme by having materials with different etch selectivities, the taper being formed on one side of the aperture.
Figure 8:
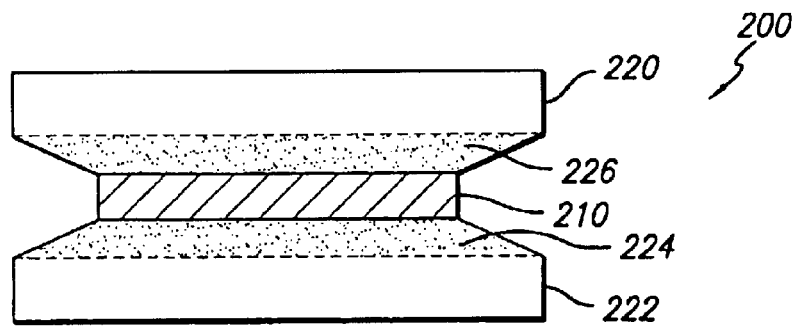
FIG. 8 shows a tapered aperturing scheme by having materials with different etch selectivities, the taper being formed on both sides of the aperture.

In another embodiment of the present invention, a device 100, 200 is apertured by selectively etching an aperture 110, 210 between a first 226 and a second surface 124, 224. At least one of the surfaces is tapered as shown in FIGS. 7 and 8. By properly choosing the materials, based on the selectivity of etching, within the aperture and within the adjacent surfaces 124, 224, 226 it is possible to etch the aperture 110, 210 at a rate substantially faster than the adjacent surfaces to provide tapering. Thus, the material of the surfaces is etched vertically as well as laterally. The tapered surfaces can be very beneficial to the VCSEL design by providing an optical lens for focusing the light into the active region 110, 210.

The aperture schemes of FIGS. 7 and 8 can utilize an InAlGaAs active region 110, 210 along with InP cladding layers 120, 122, 220, 222. The tapered surfaces 124, 224, can be formed of InAlAs, for example. The InAlAs can serve as a barrier layer for the quantum wells of the active region 110, 210. The InAlAs can also serve as part of the tunnel junction 5 of FIG. 2.

Figure 9:
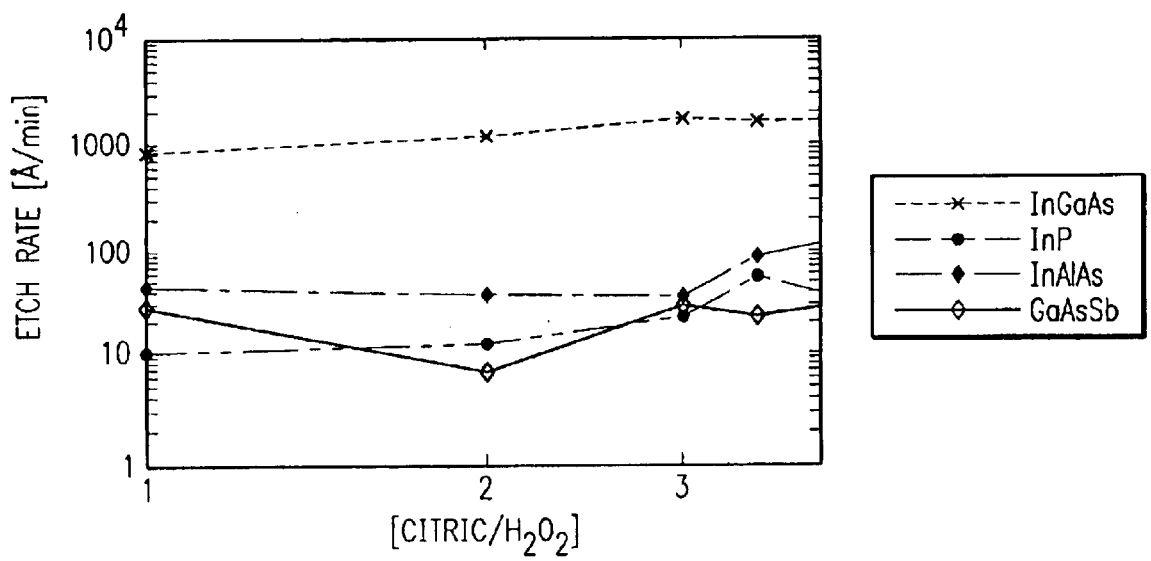
FIG. 9 depicts a plot of the etch rates of different alloys that are lattice matched to InP with an etchant comprising of hydrogen peroxide diluted citric acid.

FIG. 9 illustrates the different etch rates for different materials and various dilutions of the etchant $CH_3COOH:H_2O_2$. Looking at the etch rates for the different materials for an etchant ratio of unity, it can be seen that InP is at approximately 10, InAlAs is at approximately 40 and InGaAs is at approximately 900. InGaAs typically is not used as an aperture by itself because it is absorbing, it has the lowest band gap. The alloy InAlGaAs which can be used in the aperture, is not illustrated in the plot, but would lie somewhere between the plot for InAlAs and InGaAs. Both the InAlGaAs and InAlAs are very selective (etched rapidly) compared to InP. Selective etch of InGaAs is clearly obtained comparing to the other systems lattice-matched to InP such as InAlAs and GaAsSb. The selectivity of about 30:1 between InGaAs and InAlAs implies that no significant difference between the materials is really needed. Nevertheless the best selectivities are achieved with alloys having larger discrepancy of the atomic composition. The best selectivity of 143:1 has been obtained between InGaAs and GaAsSb. Thus, this selectivity based etching finds important usage in aperturing VCSELs. Thus, the InAlAs of the tapered surfaces is etched faster than the InP of the cladding layers but much more slowly than the InAlGaAs active region, resulting in the tapered surfaces. Adding more Ga to the InAlGaAs tends to result in even faster etching of the active region relative to the other regions. Ga can also be added to the InAlAs to provide faster etching of the surfaces 124, 226, 224. However, Ga is usually not added to the InAlAs when the InAlAs is to be used as part of the tunnel junction 5 because the electrical conductivity of the tunnel junction is better with InAlAs rather than a quaternary material. By using different alloy compositions, and different etching chemicals and dilutions, this approach allows the tuning of the selectivity. $Al_xIn_{1-x-y}Ga_yAs$ alloys can be used for this purpose. A direct application of this technique is to generate tapered apertures by using a composition grading. Different dilutions of the etching chemicals will provide different aperture angles.

This selective etch aperturing method is useful in-plane semiconductor laser diodes, heterostructure bipolar transistors (HBT) and VCSELS, as well as other devices where an aperture is useful for confining current and/or an optical mode.

In general the an aperture is formed by selective etching (meaning etching different materials at different rates) of a material substantially lattice matched to InP, or similar material, relative to layers of InP, or similar material, between which it is sandwiched. The etched material can include As combined with group V materials such as B, Al, Ga, In, or Ti. The etched layer does not necessarily need to be the active region, but it can be the active region since the active region is composed of materials that can be substantially lattice matched to InP. The etched layer, for example, can be a layer of InAlAs or InAlGaAs, both of which can be substantially lattice matched to InP. This selective etching can be used to form apertures between InP layers in VCSELs. Where the active region is composed of As materials, the selective etching can be used to etch the active region.

Figure 10:
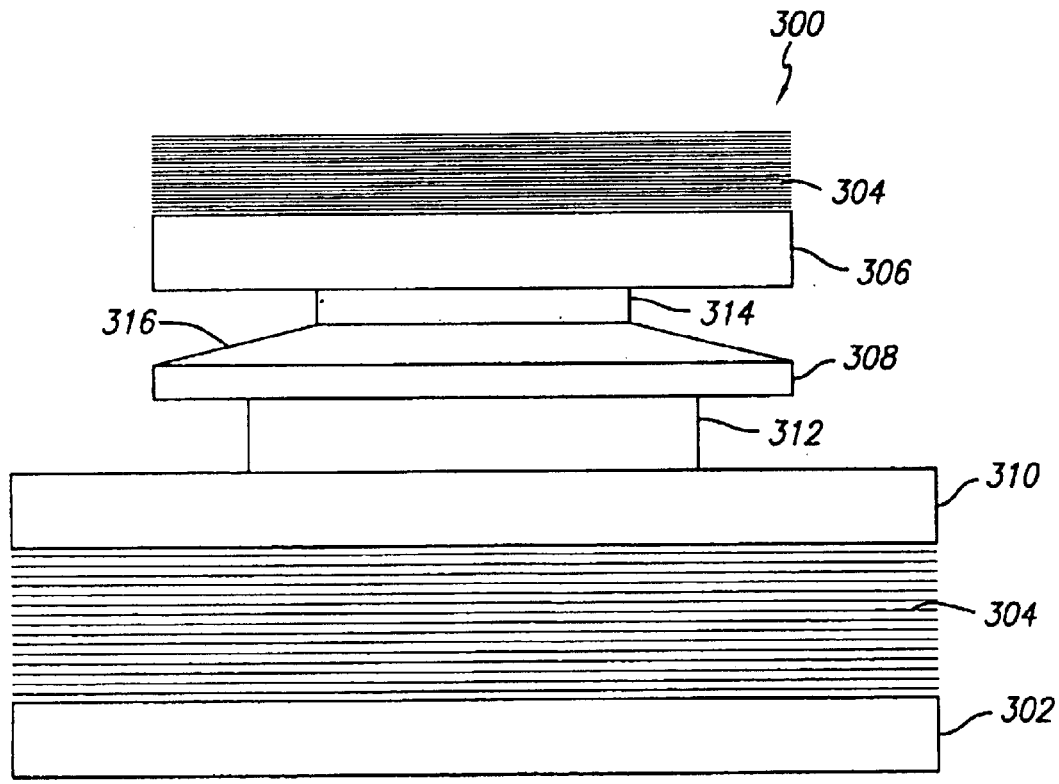
FIG. 10 schematically illustrates a more general embodiment of the selective aperturing method of the present invention.

FIG. 10 schematically illustrates a more general embodiment of the selective aperturing method of the present invention. A VCSEL 300 has a substrate 302, mirrors 304, InP layers 306, 308, 310, and active region 312 also illustrated is an aperture 314 and tapered surface 316. In the general embodiment the aperture does not need to be formed in the active region. One or more apertures can be formed between any two InP layers. The aperture 314 can be composed of a material lattice matched to InP, typically a material composed of As, such as InAlGaAs or InAlAs. The aperture 314 material should have a relatively high selectivity, or etching rate, relative to InP. FIG. 10 shows two apertures 312, 314, wherein the aperture 312 is also the active region. In some embodiments, one aperture can serve to confine the current while another serves to confine the optical mode. Any of the apertures can include a composition grading to achieve different tapering angles. FIG. 10, for example, includes a tapered surface of InAlAs or InAlGaAs (having a lower Ga content than does the section 314 of the aperture) which will etch slower than the InAlGaAs aperture 314. The material of the aperture 314 should be lattice matched to InP and have a greater selectivity than InP when etched by the etchant. Many layers of apertures sandwiched between layers of InP can be created by alternatively etching through an InP layer without significantly etching the As containing layer, next etching the As containing aperture layer without significantly etching the InP layer, and then starting the process again by etching through the next InP layer without significantly etching the next As containing layer. The tunnel junction, if included, should be adjacent the active region.

The present embodiment is not limited to InP, but rather, other similar materials with similar properties can be substituted.

In a nutshell, unlike shorter-wavelength AlGaAs-based VCSELs, there is no natural oxidizable material in an InP-based monolithic VCSEL from which an oxide aperture can be formed. By taking advantage of the different materials used in AlAsSb-based VCSEL's, however, a selective etch can be used to partially remove the InAlGaAs-based active region 6 while precluding substantial etching of the AlGaAsSb-based DBRs 4. This aperturing thereby confines the current and the mode to the center of the structure. Furthermore, this scheme of selectively etching the active region at a rate faster than the rate of etching of the DBR's produces an aperture of increasing size. This helps eliminate some sidewall scattering loss and, therefore, lowers the threshold current density and increases the external quantum efficiency of the VCSEL.

While the specification describes particular embodiments of the present invention, those of ordinary skill can devise variations of the present invention without departing from the inventive concept. For example, the mixture may be designed in a manner to control the etch rate of the active region in a specific fashion. Furthermore, the mixture may also have different compositions in differing ratios. Other etchants such as $H_3PO_4$, $H_2O_2$ or their combinations may also be used.

We claim:

1. A method for aperturing a vertical-cavity surface-emitting laser (VCSEL) for increasing external quantum efficiency, the method comprising:
   forming an aperture by selectively etching an aperture layer between a first and a second cladding surface, said first and the second cladding surfaces and said aperture layer are formed on an InP substrate;
   said aperture reducing loss due to scattering in a cavity of a VCSEL, thereby increasing external quantum efficiency of said VCSEL; and
   wherein the etching of the aperture layer is at a rate substantially higher than a rare of etching for at least one of the first and second cladding surface.

2. The method for aperturing a vertical-cavity surface-emitting laser (VCSEL) according to claim 1, wherein the etching is performed by a mixture comprised of a predetermined ratio of citric acid to hydrogen peroxide.

3. The method for aperturing a vertical-cavity surface-emitting laser (VCSEL) according to claim 2, wherein the predetermined ratio of citric acid to hydrogen peroxide is about 3:1.

4. A method for aperturing a vertical-cavity surface-emitting laser (VCSEL) for increasing external quantum efficiency, the method comprising:
   lattice marching a first reflecting surface with a first substrate layer;
   lattice matching a second reflecting surface with a second substrate layer;
   wherein the first substrate layer and the second substrate layers are formed on an InP material;
   etching an aperture layer on the InP material between the first and the second substrate layer to form an aperture, said aperture having a predetermined size; and
   said aperture reducing loss due to scattering in a cavity of a VCSEL, thereby increasing external quantum efficiency of said VCSEL.

5. The method for aperturing a vertical-cavity surface-emitting laser (VCSEL) according to claim 4, wherein the first reflecting surface is a first Distributed Bragg Reflector (DBR).

6. The method for aperturing a vertical-cavity surface-emitting laser (VCSEL) according to claim 4, wherein the second reflecting surface is a second Distributed Bragg Reflector (DBR).

7. The method for aperturing a vertical-cavity surface-emitting laser (VCSEL) according to claim 4, wherein the first substrate layer and the second substrate layer are of InP.

8. The method for aperturing a vertical-cavity surface-emitting laser (VCSEL) according to claim 4, wherein the etching is performed by a mixture comprised of a predetermined ratio of citric acid to hydrogen peroxide.

9. The method for aperturing a vertical-cavity surface-emitting laser (VCSEL) according to claim 8, wherein the predetermined ratio of citric acid to hydrogen peroxide is about 3:1.

10. A vertical-cavity surface-emitting laser (VCSEL) for increasing external quantum efficiency, the VCSEL comprising:
    a first and a second cladding layer, said first and the second cladding layers are formed on an InP substrate;
    an aperture layer substantially lattice matched to the first and the second cladding layer, the aperture layer formed on the InP substrate;
    an aperture formed by selectively etching the aperture layer to a predetermined size in comparison to a size of at least one of the first and second cladding layers; and
    said aperture reducing a loss due to scattering in a cavity of a VCSEL, thereby increasing external quantum efficiency of said VCSEL.

11. The VCSEL according to claim 10, wherein the VCSEL further comprises a first and a second reflecting surface substantially lattice matched to the first and the second cladding layer respectively.

12. The VCSEL according to claim 11, wherein the first reflecting surface is a first Distributed Bragg Reflector (DBR) and the second reflecting surface is a second Distributed Bragg Reflector (DBR).

13. The VCSEL according to claim 12, wherein the first DBR and second DBR are made of alternating layers of $Al_{a1}Ga_{1-a1}As_bSb_{1-b}$ and $Al_{a2}Ga_{1-a2}As_bSb_{1-b}$ approximately lattice matched to InP.

14. The VCSEL according to claim 13, wherein b is greater than about 0.5, a1 is greater than about 0.9, and a2 is less than about 0.3.

15. The VCSEL according to claim 12, wherein die first DBR and the second DBR are substantially undoped.

16. The VCSEL according to claim 10, wherein the aperture is formed by etching with a predetermined ratio of citric acid to hydrogen peroxide.

17. The VCSEL according to claim 16, wherein said ratio of citric acid to hydrogen peroxide is about 3:1.

18. The VCSEL according to claim 13, wherein the first DBR and the second DBR have between eighteen and thirty-five layers of $Al_{a1}Ga_{1-a1}As_bSb_{1-b}$ and $Al_{a2}Ga_{1-a2}As_bSb_{1-b}$.

19. The VCSEL according to claim 16, wherein the aperture layer is etched to a predetermined diameter by the citric acid and hydrogen peroxide.

20. The VCSEL according to claim 19, wherein the aperture layer is etched at a rate substantially faster than a rate of etch of at least one of the first and second cladding layers.

21. A vertical-cavity surface-emitting laser (VCSEL) for decreasing threshold current, the VCSEL comprising:
   a first reflecting surface,
   a second reflecting surface;
   an aperture layer with a first surface and a second surface, said aperture layer formed on an InP substrate;
   a first cladding layer between the first reflecting surface and the first surface of the aperture layer;
   a second cladding layer between the second reflecting surface and the second surface of the aperture layer;
   wherein, said first and second cladding layers are formed on the InP substrate;
   an aperture formed by selectively etching the aperture layer to a predetermined size in comparison to a size of at least one of the first and second cladding layers; and
   said aperture reducing a loss due to scattering in a cavity of a VCSEL, thereby decreasing threshold current in said VCSEL.

22. The VCSEL according to claim 21, wherein the first surface of the aperture layer has a tunnel junction.

23. The VCSEL according to claim 21, wherein the first cladding layer and the second cladding layer are made of InP.

24. The VCSEL according to claim 21, wherein the first reflecting surface is a first Distributed Bragg Reflector (DBR) and the second reflecting surface is a second Distributed Bragg Reflector (DBR).

25. The VCSEL according to claim 24, wherein the first DBR and second DBR are made of alternating layers of $Al_{a1}Ga_{1-a1}As_bSb_{1-b}$ and $Al_{a2}Ga_{1-a2}As_bSb_{1-b}$ approximately lattice matched to InP.

26. The VCSEL according to claim 25, wherein b is greater than about 0.5, a1 is greater than about 0.9, and a2 is less than about 0.3.

27. The VCSEL according to claim 24, wherein the first DBR and the second DBR are undoped.

28. The VCSEL according to claim 21, wherein the aperture is formed by etching through a predetermined ratio of citric acid to hydrogen peroxide.

29. The VCSEL according to claim 28, wherein said ratio of citric acid to hydrogen peroxide is about 3:1.

30. The VCSEL according to claim 25, wherein the first DBR and the second DBR have between eighteen and thirty-five layers of $Al_{a1}Ga_{1-a1}As_bSb_{1-b}$ and $Al_{a2}Ga_{1-a2}As_bSb_{1-b}$.

31. The VCSEL according to claim 28, wherein the aperture layer is etched to a predetermined diameter by the citric acid and hydrogen peroxide.

32. The VCSEL according to claim 31, wherein at least one of the first and the second cladding layer is etched at a rate slower than an etch rate of the aperture layer.

33. A method for aperturing a vertical-cavity surface-emitting laser (VCSEL) for increasing external quantum efficiency and decreasing threshold current, the method comprising:
   forming an aperture of a predetermined size by selectively etching an aperture layer between a first and a second cladding surface, wherein the etching of the aperture layer is at a rate substantially higher than a rate of etching of the at least first and the second cladding surface;
   wherein said first and the second cladding surfaces and the aperture layer are formed on an InP substrate; and
   said aperture reducing loss due to scattering in a cavity of a VCSEL, thereby increasing external quantum efficiency and decreasing threshold current of said VCSEL.

34. The method for aperturing a VCSEL according to claim 33, wherein the VCSEL further comprises a first and a second reflecting surface.

35. The method for aperturing a VCSEL according to claim 34, wherein the first reflecting surface is a first Distributed Bragg Reflector (DBR) and the second reflecting surface is a second Distributed Bragg Reflector (DBR).

36. The method for aperturing a VCSEL according to claim 35, wherein the first DBR and second DBR are made of alternating layers of $Al_{a1}Ga_{1-a1}As_bS_{1-b}$ and $Al_{a2}Ga_{1-a2}As_bSb_{1-b}$ approximately lattice marched to InP.

37. The method for aperturing a VCSEL according to claim 36, wherein b is greater than about 0.5, a1 is greater than about 0.9, and a2 is less than about 0.3.

38. The method for aperturing a VCSEL according to claim 33, wherein the first DBR and the second DBR are undoped.

39. The method for aperturing a VCSEL according to claim 33, wherein the aperture is formed by etching through a predetermined ratio of citric acid to hydrogen peroxide.

40. The method for aperturing a VCSEL according to claim 39, wherein said ratio of citric acid to hydrogen peroxide is about 3:1.

41. The method for aperturing a VCSEL according to claim 36, wherein the first DBR and the second DBR have between eighteen and thirty-five layers of $Al_{a1}Ga_{1-a1}As_bSb_{1-b}$ and $Al_{a2}Ga_{1-a2}As_bSb_{1-b}$.

42. The method for aperturing a VCSEL according to claim 39, wherein the aperture layer is etched to a predetermined diameter by the citric acid and hydrogen peroxide.

43. The method for aperturing a VCSEL according to claim 42, wherein at least one of the first and the second cladding surface is etched at a rate slower than an etch rate of the aperture layer.

44. The method for aperturing a VCSEL according to claim 38, wherein the decrease in threshold current is more than about 20%.

45. The method for aperturing a VCSEL according to claim 38, wherein the increase in quantum efficiency is more than about 10%.

46. A method for aperturing a vertical-cavity surface-emitting laser (VCSEL) for increasing external quantum efficiency and decreasing threshold current, the method comprising:

coating a wall of at least one cladding surface in a VCSEL with a dielectric to prevent substantial etching of the at least one cladding surface, the at least one cladding surface formed on an InP substrate;

forming an aperture by selectively etching an aperture layer of a VCSEL with an etchant, the aperture formed on the InP substrate; and said aperture reducing loss due to scattering in a cavity of a VCSEL, thereby increasing external quantum efficiency and decreasing threshold current of said VCSEL.

47. The method for aperturing a VCSEL according to claim 46, wherein the etchant is composed of citric acid and hydrogen peroxide in a predetermined ratio.

48. The method for aperturing a VCSEL according to claim 46, wherein the etchant is either $H_3PO_4$, or $H_2O_2$, or $H_2O$, or any combination thereof.

49. A method for aperturing a vertical-cavity surface-emitting laser (VCSEL) for increasing external quantum efficiency, the method comprising:

selectively etching an aperture between a first and a second cladding surface;

wherein said first and the second cladding surfaces are formed on an InP substrate;

said aperture designed to reduce loss due to scattering in a cavity of a VCSEL, thereby increasing external quantum efficiency of said VCSEL; and wherein the aperture is etched at a rate substantially faster than a rate at which at least one of the first and second surfaces is etched.

50. A method for aperturing a vertical-cavity surface-emitting laser (VCSEL) for increasing external quantum efficiency, the method comprising:

selectively etching an aperture layer between a first and a second, the aperture layer being formed on an InP substrate and including at least one material with a gradually changing composition between the first and the second surface;

said first and the second surface formed on the InP substrate; wherein;

at least one of the first and second surfaces has a taper;

at least one of the first and second surfaces is formed from a first material which is etched at a rate substantially lower than the rate at which a second material forming the aperture is etched; and wherein a selectivity of the etching between the first material and the second material is substantially lesser than unity.

51. The method according to claim 50, wherein the first material is a compound having InAlAs.

52. The method according to claim 50, wherein the second material is a compound having InGaAlAs.

53. The method according to claim 50, further including a first and a second cladding layer lattice matched to the first and second surfaces respectively.

54. The method according to claim 53, wherein the first and the second cladding layer is formed of InP.

55. The method according to claim 54, wherein the aperture layer is selectively etched using an etchant containing citric acid and hydrogen peroxide.

56. A semiconductor laser comprised of:

photon reflecting mirrors;

cladding layers formed on InP substrate;

an aperture layer sandwiched between the cladding layers, the aperture layer formed on the InP substrate; and a first etched aperture lattice matched to InP and having a lateral surface area less than that of at least one of the cladding layers.

57. The laser of claim 56 wherein the material of the aperture includes As.

58. The laser of claim 57 wherein the material of the aperture includes a group V element.

59. The laser of claim 57 wherein the material of the aperture includes an element of the group including: Al, Ga, and In.

60. The laser of claim 56, further comprising a second etched aperture lattice matched to InP, having a lateral surface area less than that of at least one of the cladding layers, and separated from the first aperture by a layer of InP.

61. The laser of claim 60 wherein the first aperture confines the current and the second aperture confines the optical mode.

62. The method for aperturing a vertical-cavity surface-emitting laser (VCSEL) according to claim 2, wherein the etch has a selectivity of about 100:1.

63. The method for aperturing a vertical-cavity surface-emitting laser (VCSEL) according to claim 1, wherein the aperture layer comprises of InAlGaAs.

64. The method for aperturing a vertical-cavity surface-emitting laser (VCSEL) according to claim 4, further comprising etching at least one of the first and the second substrate layers with reactive ion etch.

65. The method far aperturing a vertical-cavity surface-emitting laser (VCSEL) according to claim 4, wherein the aperture layer comprises of InAlGaAs.

66. The method for aperturing a vertical-cavity surface-emitting laser (VCSEL) according to claim 8, wherein the etch has a selectivity of about 100:1.

67. The VCSEL according to claim 16, wherein the etch has a selectivity of about 100:1.

68. The VCSEL according to claim 28, wherein the etch has a selectivity of about 100:1.

69. The method for aperturing a VCSEL according to claim 40, wherein the etch has a selectivity of about 100:1.

70. The method for aperturing a VCSEL according to claim 33, further comprising etching at least one of the first and the second cladding surface with a reactive ion etch.

71. The method for aperturing a vertical-cavity surface-emitting laser (VCSEL) according to claim 50, wherein the at least one material includes Al.

72. The method for aperturing a vertical-cavity surface-emitting laser (VCSEL) according to claim 50, wherein the at least one material includes Ga.

73. The method for aperturing a vertical-cavity surface-emitting laser (VCSEL) according to claim 1, wherein the first and the second cladding surfaces are made of InP.

74. The method for aperturing a vertical-cavity surface-emitting lass (VCSEL) according to claim 1, wherein the aperture layer is an active region.

75. The method for aperturing a vertical-cavity surface-emitting laser (VCSEL) according to claim 4, wherein the aperture layer is an active region.

76. The vertical-cavity surface-emitting laser (VCSEL) according to claim 10, wherein the aperture layer is an active region.

77. The vertical-cavity surface-emitting laser (VCSEL) according to claim 10, wherein the aperture layer is comprised of InAlGaAs.

78. The vertical-cavity surface-emitting laser (VCSEL) according to claim 10, wherein the first and the second cladding surfaces are made of InP.

79. The vertical-cavity surface-emitting laser (VCSEL) according to claim 21, wherein the aperture layer is comprised of InAlGaAs.

80. The vertical-cavity surface-emitting laser (VCSEL) according to claim 21, wherein the aperture layer is an active region.

81. The method for aperturing a vertical-cavity surface-emitting laser (VCSEL) according to claim 33, wherein the first and the second cladding layers are made of InP.

82. The method for aperturing a vertical-cavity surface-emitting laser (VCSEL) according to claim 33, wherein the aperture layer is an active region.

83. The method for aperturing a vertical-cavity surface-emitting laser (VCSEL) according to claim 33, wherein the aperture layer is comprised of InAlGaAs.

84. The method for aperturing a vertical-cavity surface-emitting law (VCSEL) according to claim 46, wherein the at least one cladding surface is made of InP.

85. The method for aperturing a vertical-cavity surface-emitting laser (VCSEL) according to claim 46, wherein the aperture layer is comprised of InAlGaAs.

86. The method for aperturing a vertical-cavity surface-emitting laser (VCSEL) according to claim 46, wherein the aperture layer is an active region.

87. The method for aperturing a vertical-cavity surface-emitting laser (VCSEL) according to claim 50, wherein the aperture layer is comprised of InAlGaAs.

88. The method for aperturing a vertical-cavity surface-emitting laser (VCSEL) according to claim 50, wherein the aperture layer is an active region.

89. The method for aperturing a vertical-cavity surface-emitting laser (VCSEL) according to claim 56, wherein the aperture layer is comprised of InAlGaAs.

90. The method for aperturing a vertical-cavity surface-emitting laser (VCSEL) according to claim 56, wherein the aperture layer is an active region.

91. The method for aperturing a vertical-cavity surface-emitting laser (VCSEL) according to claim 56, wherein the cladding surfaces are made of InP.

92. The method for aperturing a VCSEL according to claim 56, wherein the aperture is formed by selectively etching the aperture layer by an etchant composed of citric acid and hydrogen peroxide in a predetermined ratio.

93. The method for aperturing a vertical-cavity surface-emitting laser (VCSEL) according to claim 4, wherein the first and the second cladding surfaces are made of InP.

* * * * *